(12) United States Patent
Kim et al.

(10) Patent No.: US 7,915,595 B2
(45) Date of Patent: Mar. 29, 2011

(54) X-RAY DETECTOR AND METHOD OF MANUFACTURING THE SAME

(75) Inventors: Dong-Cheol Kim, Suwon-si (KR);
Dae-Ho Choo, Yongin-si (KR);
Kwan-Wook Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 15 days.

(21) Appl. No.: 12/176,899

(22) Filed: Jul. 21, 2008

(65) Prior Publication Data

US 2009/0026383 A1    Jan. 29, 2009

(30) Foreign Application Priority Data

Jul. 23, 2007    (KR) .................. 10-2007-0073624

(51) Int. Cl.
*G01T 1/20* (2006.01)
(52) U.S. Cl. ................................. 250/370.11
(58) Field of Classification Search ............ 250/370.11
See application file for complete search history.

(56) References Cited

U.S. PATENT DOCUMENTS

| | | | |
|---|---|---|---|
| 6,961,088 B2* | 11/2005 | Kameshima et al. | 348/303 |
| 2002/0017613 A1* | 2/2002 | Homme et al. | 250/370.11 |
| 2005/0026004 A1* | 2/2005 | Okada et al. | 428/704 |
| 2006/0152648 A1* | 7/2006 | Kim et al. | 349/58 |
| 2007/0205371 A1* | 9/2007 | Inoue | 250/370.11 |

* cited by examiner

*Primary Examiner* — David P Porta
*Assistant Examiner* — Mindy Vu
(74) *Attorney, Agent, or Firm* — Innovation Counsel LLP

(57) ABSTRACT

Disclosed is an X-ray detector and a method of manufacturing the X-ray detector. A cushion layer is interposed between a scintillator panel for converting X-rays into visual light and a lower substrate formed with a thin film transistor, a photoelectric conversion device. Thus, the lower substrate and the scintillator panel can be bonded to each other such that no air layer can be introduced between the lower substrate and the scintillator panel. Therefore, no air layer is introduced, and thus, it is possible to prevent the efficiency of light incident to the photoelectric conversion device from being lowered. Further, the cushion layer is employed such that the lower substrate and the scintillator panel can be separated and reused.

16 Claims, 7 Drawing Sheets

X-RAY DETECTOR AND METHOD OF MANUFACTURING THE SAME

This application claims the benefit of priority of Korean Patent Application No. 10-2007-0073624 filed on Jul. 23, 2007 in the Korean Intellectual Property Office.

BACKGROUND OF THE INVENTION

1. Field of the Invention

The present invention relates to an X-ray detector and a method of manufacturing the same.

2. Description of the Related Art

X-ray detectors employing thin film transistors have been primarily utilized for diagnosis purposes. An X-ray detector is configured to output an X-ray image or X-ray transmission image in the form of a digital signal. Such an X-ray detector can be generally divided into two types, i.e. direct and indirect X-ray detectors.

In the direct X-ray detector, a photoconductive layer made of amorphous cerium (Ce) or the like is used to convert X-rays directly into electric charges. In the indirect X-ray detector, however, X-rays are converted into visible light by a scintillator and the converted visible light is then converted into electric charges by a photoelectric conversion device such as a photodiode. The direct X-ray detector has superior resolution, but dielectric breakdown may occur since high voltage levels are used in the direct X-ray detector. Accordingly, the reliability of the direct X-ray detector may be degraded. Further, a photoconductive material with a low dark current, high sensitivity, thermal stability and the like cannot be easily used for the direct X-ray detector. On the other hand, in the indirect X-ray detector, a photodiode or the like is used to generate a signal charge instead of using a high voltage as in the direct X-ray detector, thereby dielectric breakdown does not occur. Since basic technologies for a scintillator material, a photodiode or the like have been already established, the indirect X-ray detector can be easily commercialized. Accordingly, the indirect X-ray detector has been widely used.

To enhance the efficiency of a scintillator, the scintillator is formed by depositing a fluorescent material such as cesium iodide (CsI) into columnar single crystal. In a case where the scintillator is deposited directly on a lower substrate, the deposition process is performed at a temperature of 200° C. or more, which may cause a failure of the lower substrate. Accordingly, in an indirect X-ray detector, a scintillator is bonded to a lower substrate on which a thin film transistor, a photoelectric conversion device and the like are formed, and the efficiency of the detector greatly varies depending on the method of bonding the scintillator to the lower substrate. That is, if an air layer is introduced between the scintillator and the lower substrate when they are bonded to each other, reflection takes place at an interface between air and a medium due to a difference in refractive indexes of the air and the medium. Thus, the efficiency of light incident to the photoelectric conversion device is lowered. Meanwhile, if an air layer is partially introduced between the scintillator and the lower substrate, the uniformity of the indirect X-ray detector is degraded.

To prevent the production of such an air layer, in a related art, a reflective film and a scintillator are stacked on a glass substrate to fabricate a scintillator panel, and the scintillator panel is bonded to a lower substrate using an adhesive. However, once a scintillator panel is bonded to a lower substrate using an adhesive, the scintillator panel and the lower substrate cannot be separated to be reused even if defects are found. In particular, in a case where a resin is used as an adhesive, i.e. a liquid thermosetting resin is poured, pressed and cured between the scintillator panel and the lower substrate in order to bond the scintillator panel and the lower substrate together, the bonded scintillator panel and lower substrate cannot be separated when defects are found in the subsequent processes, and thus, the productivity is degraded.

SUMMARY OF THE INVENTION

An aspect of the present invention provides an X-ray detector wherein an air layer is not introduced between a scintillator and a lower substrate, and the scintillator and the lower substrate can be separated and reused when defects are found, and a method of manufacturing the X-ray detector.

Another aspect of the present invention provides an X-ray detector wherein a lower substrate is formed to be stepped, a cushion layer is employed between a scintillator and the lower substrate so that no air layer is introduced, and the scintillator and the lower substrate can be separated from each other when defects are found, and a method of manufacturing the X-ray detector.

Still another aspect of the present invention provides an X-ray detector wherein an adhesive member is employed between a scintillator and a lower substrate, and a cushion layer is employed between the scintillator and an upper plate so that no air layer is introduced at central portions of the scintillator and the lower substrate, and a method of manufacturing the X-ray detector.

According to an aspect of the present invention, there is provided an X-ray detector which includes a scintillator panel for converting X-rays into visible light; a lower substrate where a photoelectric conversion device for converting the visual light into electric charges is formed; and a cushion layer interposed between the lower substrate and the scintillator panel to bond the lower substrate and the scintillator panel together.

The scintillator panel may include a substrate; a reflective layer formed on the substrate; a scintillator formed on the reflective layer; and a transparent organic layer coating the substrate and the scintillator.

The scintillator panel may be formed of CsI doped with Ti, and the transparent organic layer may be formed of a polyparaxylene layer.

The scintillator panel may further include a protective layer interposed between the reflective layer and the scintillator. The reflective layer may be formed of an Ag layer, and the protective layer may be formed of a silicon nitride layer. Alternatively, the reflective layer may be formed of an aluminum layer, and the protective layer may be formed of a polyimide layer or aluminum oxide layer.

The lower substrate may include gate wirings formed in one direction on an insulating substrate; data wirings formed in a direction intersecting the gate wirings; a thin film transistor formed to be partially connected to the gate and data wirings; a photoelectric conversion device partially connected to the data wirings; and a protective layer formed on an entire surface of the lower substrate including the thin film transistor and the photoelectric conversion device and formed thicker at a portion above the photoelectric conversion device than at the other portion.

The photoelectric conversion device may include a photodiode including a lower electrode, a photoconductive layer and an upper electrode.

The cushion layer may be formed of a material with excellent transparency and adjustable adhesive strength. In such a case, the cushion layer is formed of an acrylic- or silicone-based resin.

The cushion layer may further include adhesive layers formed on and below the cushion layer, respectively. The adhesive strength of a portion of the cushion layer being in contact with the lower substrate is strong, while the adhesive strength of another portion of the cushion layer being in contact with the scintillator panel is weak.

The scintillator panel may be separable from the cushion layer.

According to another aspect of the present invention, there is provided a method of manufacturing an X-ray detector, which includes separately fabricating a lower substrate, a scintillator panel and a cushion layer; bonding the cushion layer to the lower substrate; and placing the scintillator panel on the cushion layer and then pressing the scintillator panel and the cushion layer together.

A photoelectric conversion device is formed at a predetermined region on the lower substrate and a protective layer is formed on an entire surface of the lower substrate. The protective layer is formed higher at a portion corresponding to the photoelectric conversion device than at the other portion.

Adhesive strength of a portion of the cushion layer being in contact with the lower substrate is strong, while adhesive strength of another portion of the cushion layer being in contact with the scintillator panel is weak.

The scintillator panel may be separable from the cushion layer.

According to a further aspect of the present invention, there is provided an X-ray detector which includes a scintillator panel for converting X-rays into visible light; a lower substrate formed where a photoelectric conversion device for converting the visible light into electric charges is formed; an adhesive member for bonding the lower substrate and the scintillator panel closely to each other; and a cushion layer and an upper plate which are stacked on the scintillator panel.

The adhesive member may include any one of a cushion layer, optical grease or gel.

The cushion layer may have a shape of a bag in which gas or liquid is contained, and the gas may be carbon dioxide.

The cushion layer may be coated with a material with excellent X-ray transmittance and capable of tightly sealing a substance contained therein. The coating material may be aluminum.

According to a still further aspect of the present invention, there is provided a method of manufacturing an X-ray detector, which includes separately forming a lower substrate, a scintillator panel, a cushion layer and an upper plate; coating an adhesive member on the lower substrate and then bonding the scintillator panel to the lower substrate; and placing the cushion layer and the upper plate on the scintillator panel and then pressing the cushion layer, the upper plate and the scintillator panel.

BRIEF DESCRIPTION OF THE DRAWINGS

The above and other features and advantages of the present invention will become apparent from the following description of preferred embodiments given in conjunction with the accompanying drawings, in which.

DETAILED DESCRIPTION OF THE INVENTION

Hereinafter, several preferred embodiments of the present invention are described in detail with reference to the accompanying drawings. However, the present invention is not limited to the embodiments set forth herein but may be implemented into different forms. The present embodiments are provided only for illustrative purposes to fully convey the scope of the present invention to those skilled in the art.

Figure 1:
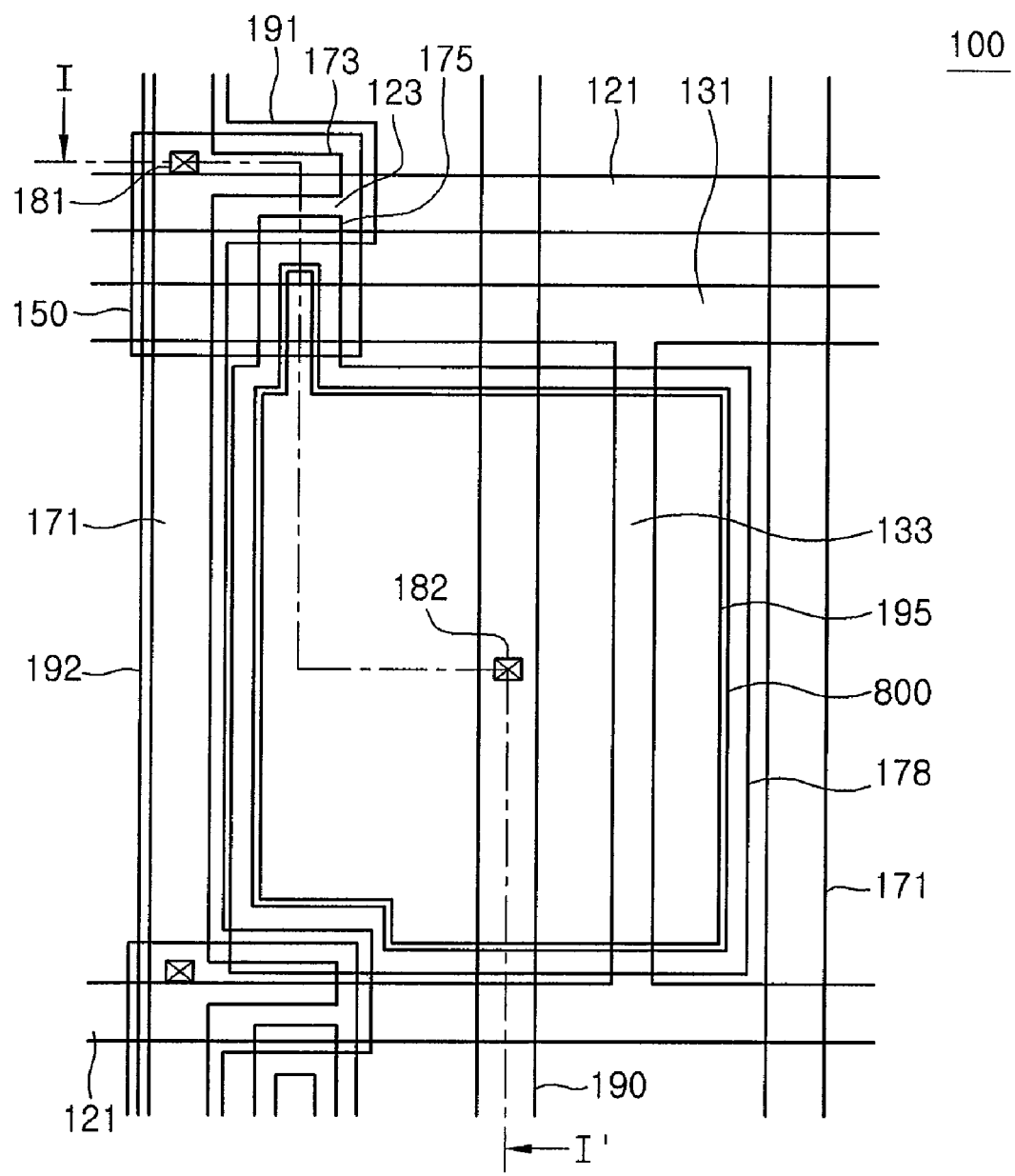
FIG. 1 is a plan view of a lower substrate used in an X-ray detector according to an exemplary embodiment of the present invention.
Figure 2:
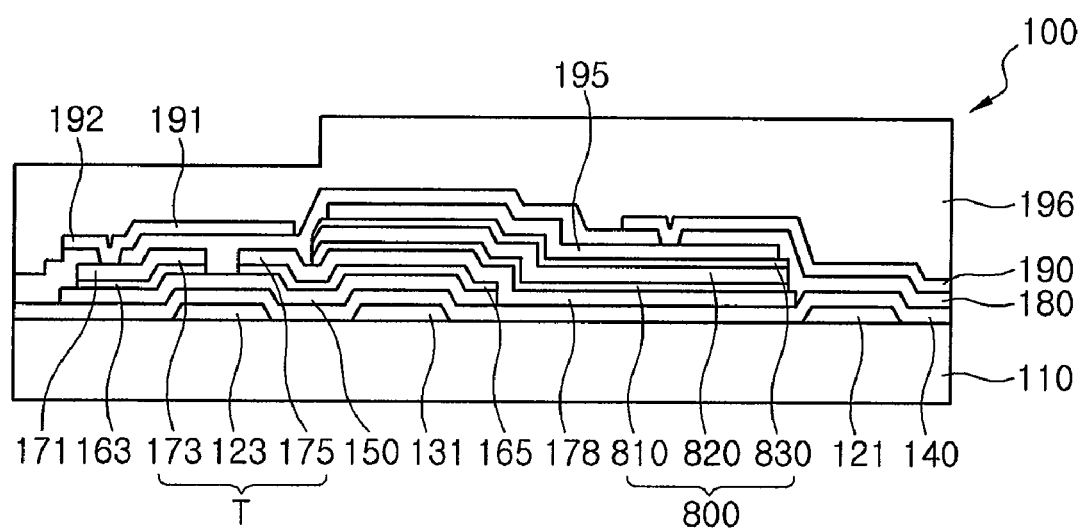
FIG. 2 is a sectional view taken along line I-I' in FIG. 1.

FIG. 1 is a plan view schematically showing a lower substrate used in an X-ray detector with a photodiode according to an exemplary embodiment of the present invention, and FIG. 2 is a sectional view taken along line I-I' of FIG. 1.

Referring to FIGS. 1 and 2, the lower substrate 100 according to the exemplary embodiment of the present invention includes gate wirings 121, 131, 123 and 133 formed in one direction, data wirings 171, 173, 175 and 178 formed in another direction, and a photodiode operating as a photoelectric conversion device for converting visible light converted from a scintillator into electric charges.

The gate wirings 121, 131, 123 and 133 are formed on an insulating substrate 110. The gate wirings 121, 131, 123 and 133 include a pair of gate lines 121 and 131 extending, for example, in a transverse direction, and a gate electrode 123 formed at a portion of the gate line 121. The gate wirings may include a gate pad (not shown) connected to an end of the gate line 121 to receive a gate signal applied from the outside and then to transmit the received gate signal to the gate line 121. Further, the gate wirings include a gate-line connection portion 133 connecting the gate lines 121 and 131. In this case, the gate lines 121 and 131 can be prevented from being short-circuited. Each of the gate wirings 121, 131, 123 and 133 may be formed of a material with low resistance, e.g. an aluminum-based metallic material.

A gate insulating layer 140 is formed on the gate wirings 121, 131, 123 and 133. The gate insulating layer 140 is formed of silicon nitride (SiNx) or other suitable material.

A semiconductor layer 150 is formed to partially overlap the pair of gate lines 121 and 131. The semiconductor layer 150 is formed on the gate insulating layer 140 which covers the gate electrode 123. The semiconductor layer 150 is formed of a semiconductor material such as amorphous silicon. The semiconductor layer 150 may be formed to extend up to a portion where a data line 171 which will be formed later intersects the gate lines 121 and 131.

Ohmic contact layers 163 and 165 are formed on the semiconductor layer 150 to be spaced apart from each other by a predetermined distance at a position above the gate electrode 123. The ohmic contact layers 163 and 165 are formed of a material such as silicide, n+ amorphous silicon hydride highly doped with n-type impurities or the like.

The data wirings 171, 173, 175 and 178 are formed on the ohmic contact layers 163 and 165 and the gate insulating layer 140. The data wirings 171, 173, 175 and 178 include a data line 171, a source electrode 173 and a drain electrode 175. The data line 171 is formed in a longitudinal direction to intersect the gate line 121 and also to define a photoelectric conversion region. The source electrode 173 is connected to the data line 171 and extends up to a top surface of the ohmic contact layer 163. The drain electrode 175 is separated from the source electrode 173 and is formed on the ohmic contact layer 165. The data wirings may include a data pad (not shown) connected to an end of the data line 171 and configured to receive an image signal from the outside. Further, the data wirings 171, 173, 175 and 178 include a lower electrode 178 of the photodiode formed on the gate insulating layer 140 in the photoelectric conversion region and connected to the drain electrode 175. Each of the data wirings 171, 173, 175 and 178 is formed of one selected from a group consisting of Mo, Mo—W alloy, Cr, Ta, Ti and combinations thereof. Data wirings 171, 173, 175 and 178 are formed to have double layers or more, one layer may be formed of an aluminum-based conductive material having low resistance, and another layer, or multiple layers, may be formed of a material having an excellent contact characteristic with other materials. As an example, Cr/Al, Cr/Al alloy or Al/Mo may be employed.

On the lower electrode 178 of the photoelectric conversion region, there is formed a photoconductive layer 800 including a first amorphous silicon layer 810 containing N-type impurities, a second amorphous silicon layer 820 containing no impurities, and a third amorphous silicon layer 830 containing P-type impurities. The photoconductive layer 800 produces electrons or holes by visible light which is converted and irradiated from the outside. An upper electrode 195 of the photodiode is formed on the photoconductive layer 800. The upper electrode 195 is formed of a transparent conductive material such as indium tin oxide (ITO), indium zinc oxide (IZO) or the like. The lower electrode 178, the photoconductive layer 800 and the upper electrode 195 constitute the photodiode.

A first protective layer 180 formed of an insulating material having a low dielectric constant of 4.0 or less is formed on the data wirings 171, 173, 175 and 178, the semiconductor layer 150 which is not covered by the data wirings 171, 173, 175 and 178, and the upper electrode 195.

First and second contact holes 181 and 182 respectively exposing the data line 171 and the upper electrode 195 are formed in the first protective layer 180. A bias wiring 190 and an auxiliary data line 192 are formed on the first protective layer 180. The bias wiring 190 is connected to the upper electrode 195 via the second contact hole 182 and formed in a longitudinal direction. The auxiliary data line 192 is connected to the data line 171 via the first contact hole 181 and overlaps with the data line 171. Here, the bias wiring 190 transmits a bias voltage capable of controlling electrons or holes generated in the photoconductive layer 800 to the upper electrode 195. The auxiliary data line 192 prevents the data line 171 from being short-circuited and also has a protrusion 191 which is used as a light shielding layer for shielding light incident to the semiconductor layer 150 of the thin film transistor.

A second protective layer 196 is formed on an entire surface of the insulating substrate 110 using an organic layer. The second protective layer 196 can be formed thicker at portions above the photodiode than at the other portions. The second protective layer 196 can be formed to have stepped portions by performing an etching process after formation of the second protective layer 196.

Figure 3:
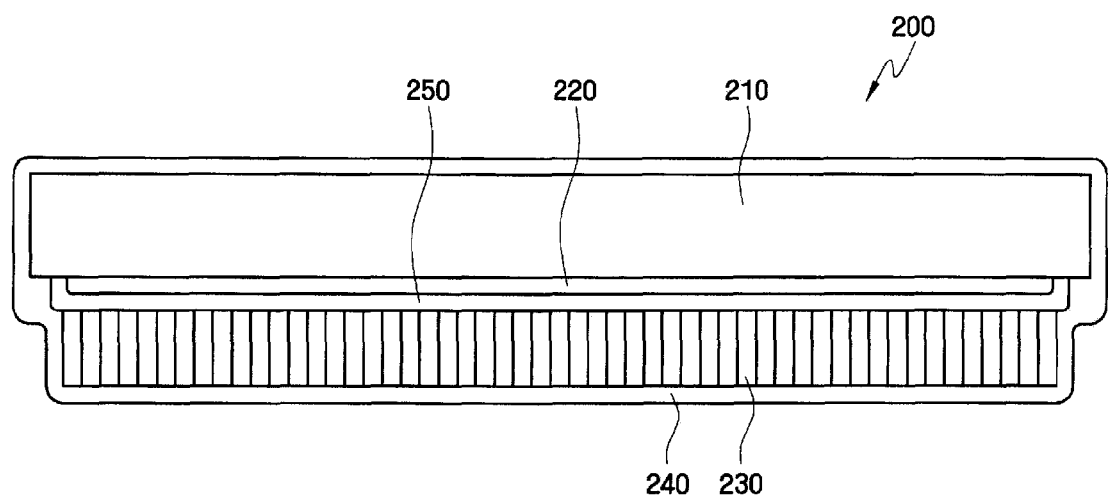
FIG. 3 is a sectional view of a scintillator panel used in the X-ray detector according to the exemplary embodiment of the present invention.

FIG. 3 is a sectional view of a scintillator panel bonded to a top surface of the lower substrate according to the exemplary embodiment of the present invention.

Referring to FIG. 3, a scintillator panel 200 includes a reflective layer 220 formed on a glass substrate 210, a scintillator 230 and a transparent organic layer 240 formed on an entire surface thereof. The reflective layer 220 is formed to have a thickness of about 100 nm using a vacuum deposition process, and formed of, for example, an aluminum layer. The column-shaped scintillator 230 converting an incident X-ray into visible light is formed on the reflective layer 220 to have a thickness of about 250 μm. CsI doped with Ti, which is grown by a vapor deposition process, is used as the scintillator 230. Further, the transparent organic layer 240 is formed on the entire surface of the scintillator panel 200 including the glass substrate 210 and the scintillator 230. The CsI, of which the scintillator 230 is formed, absorbs moisture in the air and deliquesces when it is exposed to air due to a high hygroscopic property. To prevent the deliquescence of CsI, the transparent organic layer 240 is formed. A polyparaxylene layer formed to have a thickness of about 10 μm by a CVD process is used as the transparent organic layer 240.

In addition to the aforementioned scintillator panel, scintillator panels having a variety of structures may be employed. As an example, there may be employed a scintillator panel in which a reflective layer, a protective layer 250 and a scintillator are stacked one above another on an amorphous carbon substrate and a transparent organic layer is formed on an entire surface of the scintillator panel including the amorphous carbon substrate and the scintillator. Here, in a case where an Ag layer is used as the reflective layer, a silicon nitride layer may be used as the protective layer 250. Further, in a case where an aluminum layer is used as the reflective layer, either a polyimide layer or an aluminum oxide layer may be used as the protective layer 250.

Figure 4:
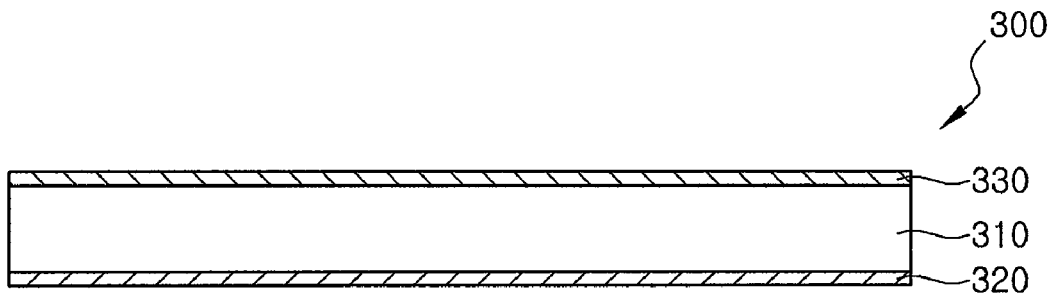
FIG. 4 is a sectional view of a cushion layer used in the X-ray detector according to the exemplary embodiment of the present invention.

FIG. 4 is a sectional view of a cushion layer formed between the lower substrate and the scintillator panel according to a first exemplary embodiment of the present invention.

Referring to FIG. 4, a cushion layer 300 according to the first exemplary embodiment of the present invention includes lower and upper adhesive layers 320 and 330 which are formed on and below a cushion portion 310, respectively. The lower adhesive layer 320 is bonded to the lower substrate, and has a strong adhesive strength to strongly bond the cushion layer 300 to the lower substrate. Further, the upper adhesive layer 330, on which the scintillator panel is placed, has a weak or no adhesive strength to weakly bond or not to bond the cushion layer 300 to the scintillator panel. An acrylic- or silicone-based resin with superior transparency and adjustable adhesive strength is used as the cushion layer 300.

In order to configure the cushion layer 300 to include at least three layers, the lower adhesive layer 320 can be formed by coating an adhesive with strong adhesive strength on a lower surface of the cushion portion 310, and the upper adhesive layer 330 can be formed by coating an adhesive with weak adhesive strength on an upper surface of the cushion portion 310. Alternatively, the lower adhesive layer 320 can be formed by attaching an adhesive tape of which both surfaces have strong adhesive strength onto the lower surface of the cushion portion 310, and the upper adhesive layer 330 can be formed by attaching an adhesive tape of which one surface has strong adhesive strength and the other surface has weak or no adhesive strength onto the upper surface of the cushion portion 310.

As described above, the cushion layer 300 is strongly bonded to the lower substrate by the lower adhesive layer 320 with strong adhesive strength, and is weakly bonded to the scintillator panel by the upper adhesive layer 330 with weak adhesive strength. Accordingly, the lower substrate and the scintillator panel can be separated from each other when defects are found later.

Figure 5:
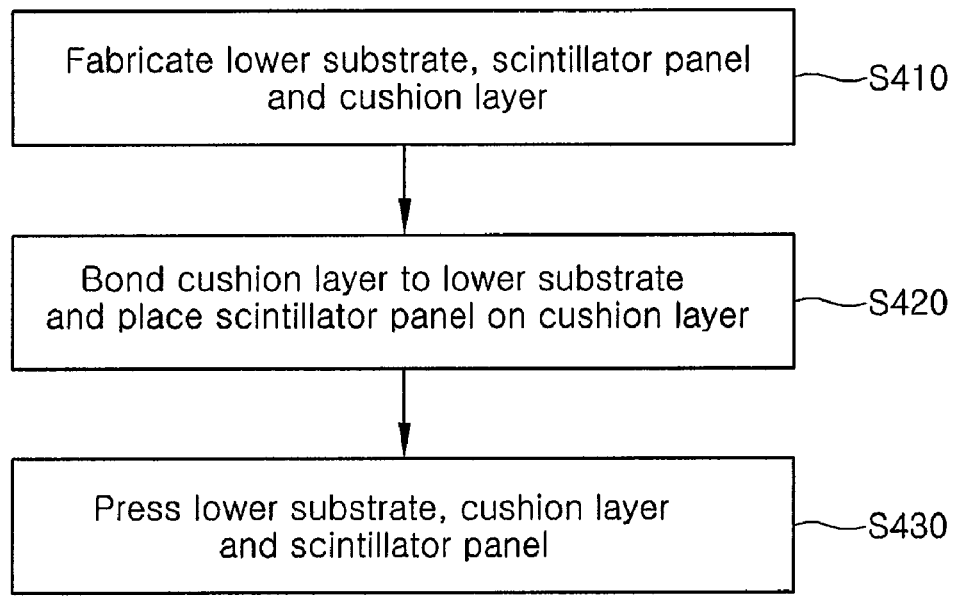
FIG. 5 is a flowchart illustrating a method of manufacturing an X-ray detector according to a first exemplary embodiment of the present invention.

Hereinafter, a method of manufacturing an X-ray detector in which a scintillator panel and a lower substrate are bonded using a cushion layer configured as described above is described with reference to FIG. 5.

A lower substrate 100, a scintillator panel 200 and a cushion layer 300 are fabricated as described above (S410). The lower substrate 100 can be fabricated such that an upper surface thereof is stepped as described above. Further, the cushion layer 300 can be fabricated such that one surface being in contact with the lower substrate 100 has a different adhesive strength from the other surface being in contact with the scintillator panel 200.

Figure 6:
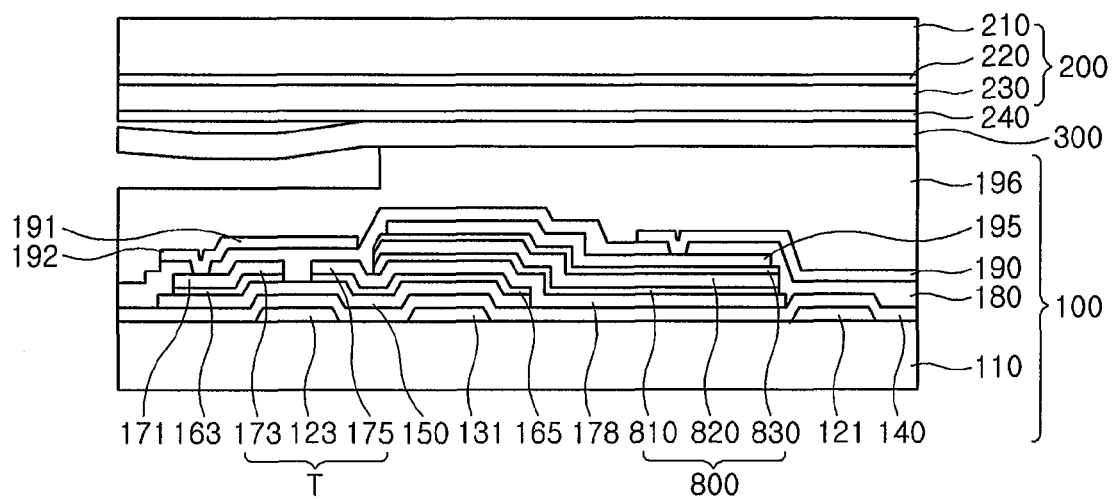
FIG. 6 is a sectional view illustrating a state where the lower substrate, the cushion layer and the scintillator panel are stacked during a process of manufacturing the X-ray detector according to the first exemplary embodiment of the present invention.

The cushion layer 300 is placed onto the lower substrate 100 and is then bonded to the lower substrate 100 using a roller (S420). Since a portion of the lower substrate 100, i.e. a portion where a photodiode is formed, is higher than the other portions, the cushion layer 300 is completely bonded at the higher portions of the lower substrate 100. Then, the scintillator panel 200 is placed on the cushion layer 300. Accordingly, the scintillator panel 200 is completely bonded to the cushion layer 300 at a portion corresponding to the higher stepped portion of the lower substrate 100, as shown in FIG. 6.

Figure 7:
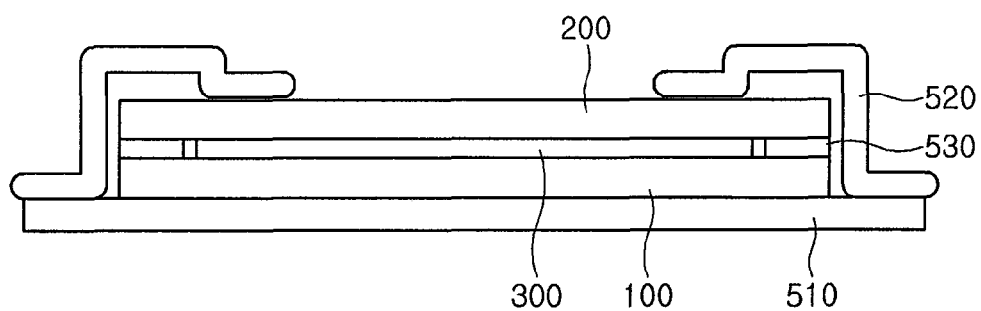
FIGS. 7 and 8 are sectional views of a plate on which a pressing member for pressing the lower substrate, the cushion layer and the scintillator panel is installed during the process of manufacturing the X-ray detector according to the first exemplary embodiment of the present invention.
Figure 8:
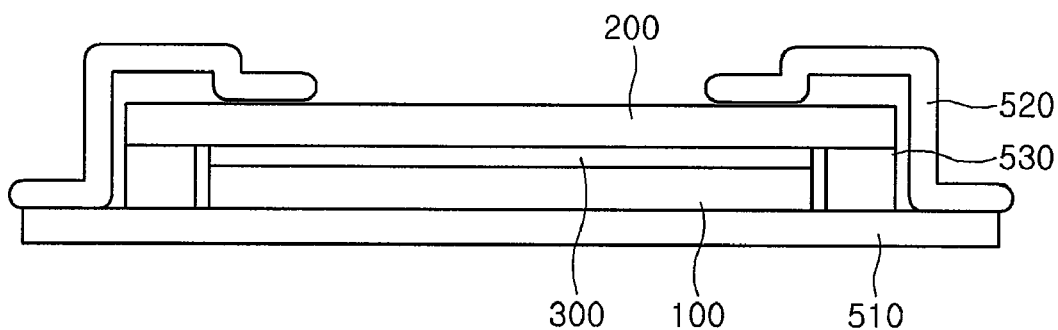

A stacked structure including the lower substrate 100, the cushion layer 300 and the scintillator panel 200 is pressed (S430). To press down the stacked structure, the stacked structure including the lower substrate 100, the cushion layer 300 and the scintillator panel 200 are placed on a plate 510 having a pressing member 520 installed along an outer periphery thereof, as shown in FIG. 7. The plate 510 is formed of a hard material such as steel or aluminum. The pressing member 520 may be fixedly installed along four sides of the plate 510 or partially installed at predetermined regions of the four sides of the plate 510. Further, a supporter 530 is interposed at an outer periphery between the lower substrate 100 and the scintillator panel 200. The supporter 530 is made of a material having higher stiffness than the cushion layer 300. The height of the supporter 530 should be lower than that of the cushion layer 300. The supporter 530 supports the scintillator panel 200, and protects the scintillator panel 200 and the lower plate 100 from an external environment like a sealant. Alternatively, the supporter 530 may be interposed either between the lower substrate 100 and the scintillator panel 200 as shown in FIG. 7, or between the plate 510 and the scintillator panel 200 as shown in FIG. 8. Then, the adjacent insides of the supporter 530 are pressed using the pressing member 520. Thereby, bending force is applied to the scintillator panel 200 and adhesion of the central portion as well as the portions pressed by the pressing member 520 can be increased. Here, the pressing force may vary according to the elastic modulus of the cushion layer 300 and may be adjusted by changing the shape of the pressing member 520 or applying a spring to a portion where the pressing member 520 is installed.

As described above, as the cushion layer 300 is interposed between the lower substrate 100 and the scintillator panel 200 and is then pressed, the cushion layer 300 is strongly bonded to the lower substrate 100 and weakly bonded to the scintillator panel 200. Accordingly, the lower substrate 100 and the scintillator panel 200 can be separated and reused when defects are found later. Further, since a portion of the lower substrate 100 where a photodiode is formed is higher than the other portions, an air layer can be pushed away to the other portions even though the air layer is introduced into the portion where the photodiode is formed. Therefore, the air layer is not introduced in the portion where the photodiode is formed, and thus, the efficiency of light incident into the photodiode is not lowered.

According to a second exemplary embodiment of the present invention, the lower substrate and the scintillator panel can be pressed together using an upper plate after forming a cushion layer used in the previous embodiment of the present invention between a lower substrate and a scintillator panel, or coating optical grease or gel. In this embodiment, another cushion layer may be interposed between the scintillator panel and the upper plate. A method of manufacturing an X-ray detector using a process according to this second embodiment is described with reference to FIGS. 9, 10 and 11.

Figure 9:
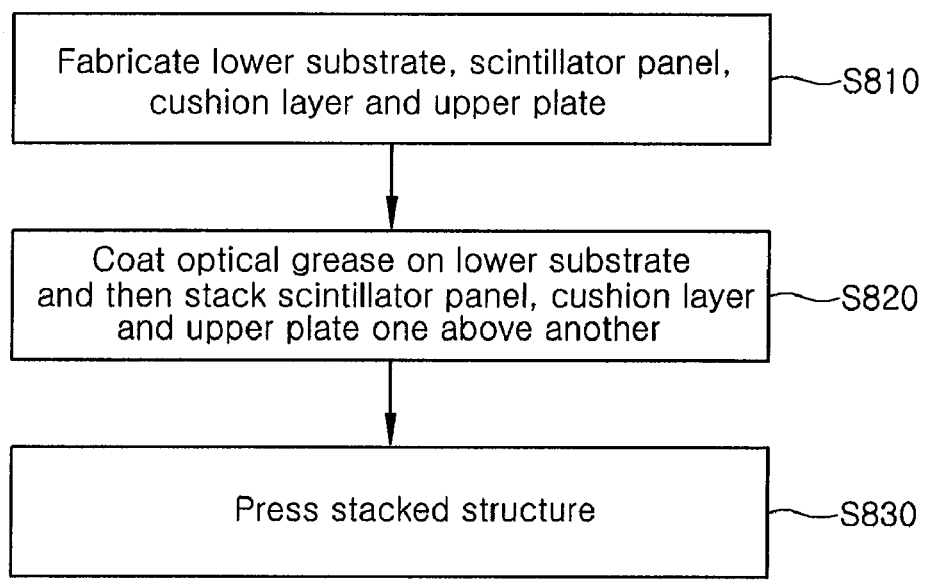
FIG. 9 is a flowchart illustrating a method of manufacturing an X-ray detector according to a second exemplary embodiment of the present invention.
Figure 10A:
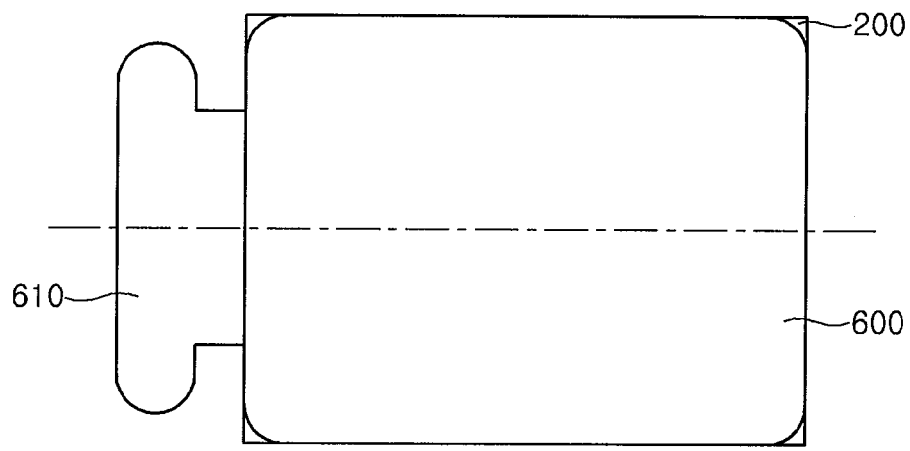
FIGS. 10a and 10b are plan and sectional views, respectively, of a cushion layer used in the X-ray detector according to the second exemplary embodiment of the present invention.
Figure 10B:
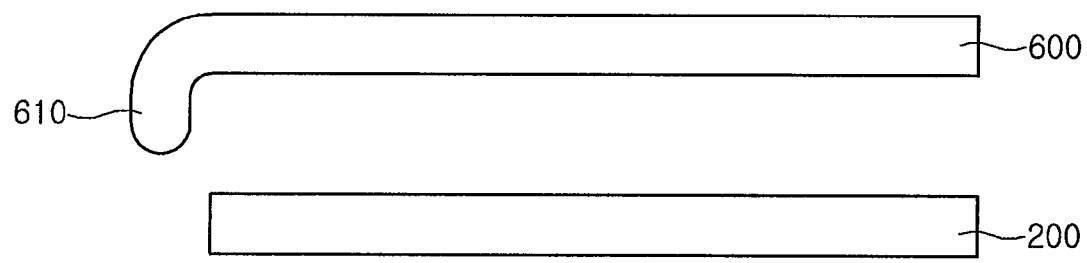
Figure 11:
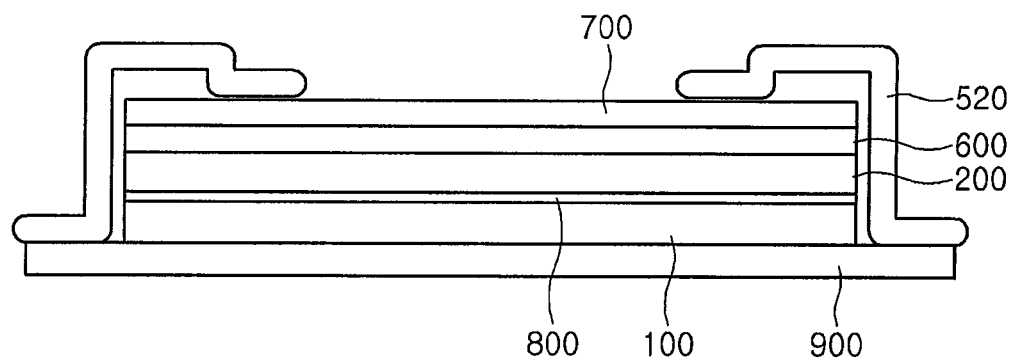
FIG. 11 is a sectional view of a laminated structure placed on a plate on which a pressing member for pressing a lower substrate, a scintillator panel and an upper plate is installed during the process of manufacturing the X-ray detector according to the second exemplary embodiment of the present invention.

FIG. 9 is a flowchart illustrating a method of manufacturing an X-ray detector according to the second exemplary embodiment of the present invention. FIGS. 10a and 10b are plan and sectional views, respectively, of a cushion layer used in the X-ray detector according to this second exemplary embodiment of the present invention. FIG. 11 is a sectional view of a laminated structure including a lower substrate 100, a scintillator panel 200, and an upper plate 700 which is pressed by a pressing member 520.

A lower substrate 100, a scintillator panel 200, a cushion layer 600 and an upper plate 700 are fabricated (S810), respectively. Here, as described with reference to FIGS. 1 and 2, the lower substrate 100 includes a thin film transistor and a photodiode as a photoelectric conversion device. The photodiode portion may be formed to be stepped higher compared to other portions, or may be formed without a step. Further, as described with reference to FIG. 3, the scintillator panel 200 may be formed to have a reflective layer, a scintillator and a transparent organic layer disposed on a substrate, or to have a reflective layer, a protective layer 250, a scintillator and a transparent organic layer disposed on a substrate. In addition, the upper plate 700 is fabricated of a hard material.

The cushion layer 600 is fabricated in the form of a bag in which gas or liquid can be contained. In a case where the cushion layer 600 is fabricated in the form of a bag, uniform force can be applied onto the surface of the cushion layer 600, because force is applied to the surface of the cushion layer 600 through the gas or liquid. Therefore, even though only an outer peripheral portion of the upper plate 700 positioned above the cushion layer 600 is pressed, uniform force can be applied throughout the entire scintillator panel 200. Further, even though the upper plate 700 is partially deformed, uniform force can be applied to the scintillator panel 200. Internal pressure of the bag-shaped cushion layer 600 should be controlled so that upper and lower surfaces of the cushion layer 600 are not brought into contact when pressure is applied. In addition, the cushion layer 600 may be fabricated by coating an aluminum thin film on acrylic- or silicone-based resin manufactured in the form of a bag in order to improve X-ray transmittance and gas sealing properties. Further, gas may be preferably used in the cushion layer 600 due to the fact that gas has a higher X-ray transmittance when compared to liquid. In this case, carbon dioxide is used as the gas.

Meanwhile, as a temperature of gas is increased, the volume of the cushion layer 600 containing the gas is also increased. When the volume of the cushion layer 600 is increased, a force applied on the scintillator panel 200 may also be increased together. Therefore, at least a portion of the cushion layer 600 is fabricated beyond a size of the scintillator panel 200 and the upper plate 700 as shown in FIGS. 10a and 10b. Accordingly, the volume change of the cushion layer 600 caused by the temperature change can be shifted to a portion 610 fabricated beyond the size of the scintillator panel 200 and the upper plate 700, and thus, the pressure variation applied to the scintillator panel 200 can be reduced.

A grease or gel 800 is coated on the lower substrate 100, and the scintillator panel 200 is then positioned on the coated lower substrate 100. The cushion layer 600 and the upper plate 700 are then placed on the scintillator panel 200 (S820).

Such a structure where the lower substrate 100, the optical grease or gel 800, the scintillator panel 200, the cushion layer 600 and the upper plate 700 are stacked one above another is pressed (S830). To press the stacked structure, the stacked structure is placed on a plate 900 having a pressing member (not shown) installed around an outer periphery thereof as shown in FIG. 11. Here, the plate 900 is formed of a hard material such as steel or aluminum. The pressing member may be fixedly installed either along four sides of the plate 900 or partially at predetermined regions of the four sides of the plate 900.

As described above, according to the first exemplary embodiments of the present invention, a cushion layer may be interposed between a scintillator panel converting X-rays into visible light and a lower substrate with a thin film transistor, a photoelectric conversion device and the like formed thereon, so that the lower substrate and the scintillator panel can be separated and reused when defects are found. Further, since a portion of the lower substrate where a photoelectric conversion device is formed is higher than the other portions, no air layer can be introduced, and thus, lowering of the efficiency of light incident into the photoelectric conversion device can be prevented.

Furthermore, according to the second exemplary embodiment of the present invention, a lower substrate and a scintillator panel having a grease or gel interposed therebetween (FIG. 11) are pressed using an upper plate, a cushion layer in the form of a bag may be interposed between the scintillator panel and the upper plate to prevent an air layer from being introduced to a central portion between the lower substrate and the scintillator panel. Accordingly, it is possible to prevent the efficiency of light incident to the photoelectric conversion device from being lowered, and the uniformity of light from being degraded.

Although the present disclosure of invention has been described in connection with the accompanying drawings and the preferred embodiments, the present teachings are not limited thereto. Accordingly, it will be understood by those skilled in the art in light of the foregoing that various modifications and changes can be made thereto without departing from the spirit and scope of the present disclosure.

What is claimed is:

1. An X-ray detector, comprising:
   a scintillator panel disposed for converting input X-rays into light;
   a first substrate having a nonplanar upper surface with raised portions facing the scintillator panel so as to receive converted light from the scintillator panel, the first substrate including under one of the raised upper surface portions thereof, a photoelectric conversion device disposed for converting light received from the scintillator panel into corresponding electric charge; and
   a cushion layer interposed between the nonplanar upper surface of the first substrate and the scintillator panel, the cushion layer having adhesive upper and lower surfaces configured to bond the first substrate to the scintillator panel by way of the interposed cushion layer.

2. The X-ray detector as claimed in claim 1, wherein the scintillator panel comprises:
   a second substrate;
   a reflective layer formed on the second substrate;
   a scintillator formed on the reflective layer; and
   a transparent organic layer coating the second substrate, the reflective layer and the scintillator.

3. The X-ray detector as claimed in claim 2, wherein the transparent organic layer comprises a polyparaxylene layer.

4. The X-ray detector as claimed in claim 2, wherein the scintillator panel further comprises a protective layer interposed between the reflective layer and the scintillator.

5. The X-ray detector as claimed in claim 4, wherein the reflective layer comprises an Ag layer, and the protective layer is formed of a silicon nitride layer.

6. The X-ray detector as claimed in claim 4, wherein the reflective layer is comprised of an aluminum layer, and the protective layer is comprised of a polyimide layer or an aluminum oxide layer.

7. The X-ray detector as claimed in claim 1, wherein the first substrate comprises:
   gate wirings formed in one direction on an insulating substrate;
   data wirings formed in another direction intersecting the gate wirings, wherein the photoelectric conversion device is connected to at least one of the data wirings;
   a thin film transistor formed to be partially connected to the gate and data wirings; and
   a protective layer defining the nonplanarity of said upper surface of the first substrate wherein a thickness of the protective layer above the photoelectric conversion device is greater than a thickness of the protective layer at another location of the first substrate not having the photoelectric conversion device.

8. The X-ray detector as claimed in claim 7, wherein the photoelectric conversion device comprises a photodiode including a lower electrode, a photoconductive layer and an upper electrode.

9. The X-ray detector as claimed in claim 1, wherein the cushion layer is formed of an acrylic- or silicone-based resin.

10. The X-ray detector as claimed in claim 1, wherein the cushion layer comprises a cushion portion having a first adhesive layer on a first side and a different second adhesive layer on an opposite side.

11. The X-ray detector as claimed in claim 10, wherein the first and second adhesive layers are respectively in contact with the first substrate and the scintillator panel, and further wherein an adhesive strength of the first adhesive layer is greater than an adhesive strength of the second adhesive layer.

12. The X-ray detector as claimed in claim 1, wherein the scintillator panel is separable from the cushion layer.

13. A method of manufacturing an X-ray detector, comprising:
   separately fabricating a first substrate having a nonplanar upper surface, a scintillator panel and a cushion layer;
   bonding the cushion layer to the nonplanar upper surface of the first substrate; and placing the scintillator panel on the cushion layer and then pressing the scintillator panel and the cushion layer toward each other.

14. The method as claimed in claim 13, wherein a photoelectric conversion device is formed at a predetermined region on the first substrate, a protective layer is formed on an entire surface of the first substrate, and the protective layer is formed to have first and second thickness portions of different thicknesses, where the different thickness portions define the nonplanar upper surface of the first substrate and where a higher one of portions of the nonplanar upper surface corresponds to the predetermined region of the photoelectric conversion device.

15. The method as claimed in claim 13, wherein the cushion layer is formed such that adhesive strength of a portion being in contact with the first substrate is stronger than that of another portion being in contact with the scintillator panel.

16. The method as claimed in claim 13, wherein the scintillator panel is separable from the cushion layer.

* * * * *